(12) United States Patent
Lou (10) Patent No.: US 11,723,122 B2
(45) Date of Patent: *Aug. 8, 2023

(54) DYNAMIC DRIVER VOLTAGE HEADROOM ADJUSTMENT

(71) Applicant: Texas Instruments Incorporated, Dallas, TX (US)

(72) Inventor: Jiana Lou, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 173 days.

This patent is subject to a terminal disclaimer.

(21) Appl. No.: 17/200,140

(22) Filed: Mar. 12, 2021

(65) Prior Publication Data
US 2021/0204373 A1 Jul. 1, 2021

Related U.S. Application Data

(63) Continuation of application No. 16/690,778, filed on Nov. 21, 2019, now Pat. No. 10,986,708, which is a (Continued)

(51) Int. Cl.
*H05B 45/10* (2020.01)
*H03M 1/68* (2006.01)
*H05B 45/37* (2020.01)

(52) U.S. Cl.
CPC ............. *H05B 45/10* (2020.01); *H03M 1/68* (2013.01); *H05B 45/37* (2020.01)

(58) Field of Classification Search
CPC ...... H05B 45/46; H05B 45/37; H05B 45/345; H05B 45/10; H03M 1/745; H03M 1/68
See application file for complete search history.

(56) References Cited

U.S. PATENT DOCUMENTS

| 6,958,719 B2* | 10/2005 | Moon | H03M 1/687 |
| | | | 341/135 |
| 7,978,107 B1* | 7/2011 | Mao | H03M 1/66 |
| | | | 323/283 |

(Continued)

FOREIGN PATENT DOCUMENTS

WO  2019027691 A1  2/2019

OTHER PUBLICATIONS

International Search Report and Written Opinion dated Mar. 24, 2020, PCT Application No. PCT/CN2019/092305, 8 pages.

(Continued)

*Primary Examiner* — Raymond R Chai
(74) *Attorney, Agent, or Firm* — Ray A. King; Frank D. Cimino (57) ABSTRACT

Aspects of the disclosure provide for a circuit including a binary-weighted DAC, a first transistor, a second transistor, a switch, a first current mirror, a second current mirror. The binary-weighted DAC is coupled between a first node and a second node and configured to receive a plurality of bits of a digital control signal. The first transistor has a source coupled to the first node, a drain coupled to a third node, and a gate coupled to a fourth node. The second transistor has a source coupled to the first node, a drain coupled to the third node, and a gate. The switch is coupled between the gate of the second transistor and the fourth node and configured to receive a partition control signal. The first current mirror is coupled to the third node and the second node. The second current mirror is coupled to the first current mirror.

18 Claims, 3 Drawing Sheets

Related U.S. Application Data continuation of application No. PCT/CN2019/092305, filed on Jun. 21, 2019.

(56) References Cited

U.S. PATENT DOCUMENTS

| | | | |
|---|---|---|---|
| 9,247,601 | B2 | 1/2016 | Hsiu et al. |
| 9,753,470 | B1 | 9/2017 | Hawley et al. |
| 2007/0279095 | A1* | 12/2007 | Jiang .................. H04L 25/0272 326/83 |
| 2012/0092902 | A1* | 4/2012 | Gaknoki .............. H05B 45/385 363/21.12 |
| 2013/0049628 | A1* | 2/2013 | Kwong .............. H05B 45/3725 315/250 |
| 2015/0333764 | A1* | 11/2015 | Pastore .................. H03M 1/68 341/145 |
| 2018/0373094 | A1 | 12/2018 | Ryoo et al. |
| 2021/0037625 | A1* | 2/2021 | Chen .................... H05B 45/325 |

OTHER PUBLICATIONS

Chou, W., et al., "An Embedded Dynamic Voltage Scaling (DVS) System Through 55 nm Single-Inductor Dual-Output (SIDO) Switching Converter for 12-Bit Video Digital-to-Analog Converter," IEEE Journal of Solid-State Circuits, vol. 47, No. 7, Jul. 2012, pp. 1568-1584.

Extended European Search Report dated Jun. 7, 2022, European Application No. 19934159.5, 17 pages.

* cited by examiner

| Cr_in | Cr_out | K | ILED | VHR |
|---|---|---|---|---|
| 128 - 255 | 128 - 255 | 1 | (128 - 255) * IREF | $Ron_x IREF$ |
| [1000 0000] - [1111 1111] | [1000 0000] - [1111 1111] | | | |
| 0 - 127 | 1 - 255 | 2 | (0 - 127) * IREF | $\dfrac{Ron_x IREF}{2}$ |
| [0000 0000] - [0111 1111] | [0000 0001] - [1111 1111] | | | |

505 — RECEIVE A BRIGHTNESS CODE

510 — MAP THE BRIGHTNESS CODE TO A CONTROL SIGNAL IN A FIRST VALUE RANGE OR A SECOND VALUE RANGE BASED ON A VALUE OF THE BRIGHTNESS CODE AND GENERATE A PARTITION CONTROL SIGNAL

515 — CONTROL A DRIVER ACCORDING TO THE CONTROL SIGNAL AND THE PARTITION CONTROL SIGNAL

520 — SOURCE CURRENT FROM THE DRIVER TO AN LED TO CAUSE THE LED TO EMIT LIGHT AT A BRIGHTNESS AT LEAST PARTIALLY DETERMINED BY THE BRIGHTNESS CODE

DYNAMIC DRIVER VOLTAGE HEADROOM ADJUSTMENT

This application is a continuation application of U.S. patent application Ser. No. 16/690,778 filed on Nov. 21, 2019, entitled "Dynamic Driver Voltage Headroom Adjustment," which is a continuation application of PCT/CN2019/092305, filed on Jun. 21, 2019, entitled "Dynamic Driver Voltage Headroom Adjustment," which Applications are hereby incorporated herein by reference in their entirety.

BACKGROUND

As light emitting diode (LEDs) replace other forms of light-emitting objects in use, such as incandescent lights, they increasingly become used in applications in which a momentary, bright light is required. One such use is as a flash, for example, for a camera. An LED implemented as a flash is controlled to be driven by a comparatively large amount of current for a short period of time to generate an intense, but momentary, light. To perform this driving of the LED in a flash application, a driver is implemented. In some examples, the driver is use-case oriented, being named a flash LED driver.

SUMMARY

Aspects of the present disclosure provide for a circuit. In at least some examples, the circuit includes a binary-weighted digital-to-analog converter (DAC), a first transistor, a second transistor, a switch, a first current mirror, a second current mirror, and a third transistor. The binary-weighted DAC is coupled between a first node and a second node and is configured to receive a plurality of bits of a digital control signal. The first transistor has a source terminal coupled to the first node, a drain terminal coupled to a third node, and a gate terminal coupled to a fourth node. The second transistor has a source terminal coupled to the first node, a drain terminal coupled to the third node, and a gate terminal. The switch is coupled between the gate terminal of the second transistor and the fourth node and is configured to receive a partition control signal. The first current mirror is coupled to the third node and the second node. The second current mirror is coupled to the first current mirror. The third transistor has a source terminal coupled to the first node, a drain terminal coupled to the second node, and a gate terminal coupled to the fourth node.

Other aspects of the present disclosure provide for a circuit. In at least some examples, the circuit includes a processing element and a driver. The processing element is configured to receive a digital input signal, partition the digital input signal to form a control signal, wherein the digital input signal is mapped to a first value range to form the control signal when the digital input signal has a value in the first value range and the digital input signal is mapped to a second value range to form the control signal when the digital input signal has a value not in the first value range, and generate a partition control signal for controlling a driver. The driver is configured to drive a light-emitting diode by receiving the control signal from the processing element, controlling a binary-weighted DAC to source an amount of current determined according to the digital input signal and a reference current to the light-emitting diode with a first voltage headroom (VHR) value determined partially according to the partition control signal when the digital input signal has the value in the first value range, and controlling the binary-weighted DAC to source the amount of current determined according to the digital input signal and the reference current to the light-emitting diode with a second VHR value determined partially according to the partition control signal when the digital input signal has the value not in the first value range.

Other aspects of the present disclosure provide for a system. In at least some examples, the system includes a power regulator, a processing element, a driver, and a light-emitting diode. The power regulator has an input configured to couple to a power source and an output coupled to a first node. The processing element is configured to generate a digital control signal and a partition control signal according to a brightness code. The driver includes a binary-weighted DAC, a first transistor, a second transistor, a switch, a first current mirror, a second current mirror, and a third transistor. The binary-weighted DAC is coupled between a first node and a second node and is configured to receive the control signal from the processing element. The first transistor has a source terminal coupled to the first node, a drain terminal coupled to a third node, and a gate terminal coupled to a fourth node. The second transistor has a source terminal coupled to the first node, a drain terminal coupled to the third node, and a gate terminal. The switch is coupled between the gate terminal of the second transistor and the fourth node, the switch configured to receive the partition control signal. The first current mirror is coupled to the third node and the second node. The second current mirror is coupled to the first current mirror. The third transistor has a source terminal coupled to the first node, a drain terminal coupled to the second node, and a gate terminal coupled to the fourth node.

BRIEF DESCRIPTION OF THE DRAWINGS

For a detailed description of various examples, reference will now be made to the accompanying drawings in which.

DETAILED DESCRIPTION

In at least some examples, a flash LED driver includes a power regulator (e.g., a buck regulator, a boost regulator, or a buck-boost regulator), one or more current sources (e.g., where the number of current sources included in the flash LED driver is determined according to a number of separate control channels of the flash LED driver), and a processing element. In some examples, the processing element is not included in the flash LED driver but is instead coupled to the flash LED driver to provide one or more control signals to the flash LED driver. Voltage headroom (VHR) in the device, or excess voltage for use in powering the one or more current sources to drive one or more corresponding LEDs, is defined as an output voltage (VOUT) of the power regulator minus a maximum forward bias voltage of any one of the LEDs coupled to the flash LED driver. In conventional approaches to flash LED drivers, VHR is constant. For example, a constant VHR is used to generate constant current outputs for driving LEDs. The constant VHR leads to at least some operational circumstances that are comparatively low efficiency, such as when the flash LED driver is operating with a light or small value load and the forward bias voltage for LEDs coupled to the flash LED driver are comparatively small in comparison to VOUT (e.g., power dissipation of current sources of the flash LED driver is a disproportionately large percentage of power dissipation of the flash LED driver). To increase efficiency of the flash LED driver, and thereby reduce energy wasted by the flash LED driver through excess VHR, some conventional circuit design techniques call for increasing a size of field-effect transistors (FETs) such as metal oxide semiconductor FETs (MOSFETs) of the current sources, thereby reducing an on resistance (Ron) of those FETs, or a resistance of the FETs when the FETs are in a conductive state, and decreasing VHR. However, increasing the size of the FETs to decrease Ron, also comes at a cost that is undesirable in some circumstances. For example, increasing the size of the FETs to reduce Ron increases a surface area of a silicon die, or other substrate, on which the FETs, or circuit(s) including the FETs, are disposed. That increase in die size is, in at least some examples, undesirable and leads to increased manufacturing costs and a reduction in possible use cases for the flash LED driver and the die on which it is implemented, such as at least because of ongoing size-reduction efforts and/or consumer desires for components, circuits, and the devices in which the components and circuits are implemented.

At least some aspects of the present disclosure provide for a circuit having a dynamic VHR. The circuit is, in some examples, a flash LED driver. In at least some examples, the circuit controls VHR according to a programmed brightness for controlling one or more LEDs coupled to the circuit. For example, a digital input signal defining a desired brightness for the LEDs is received by a processing element. Based on a value of the digital input signal, the processing element maps the digital input signal to a control signal for controlling the one or more current sources of the flash LED driver to output a current for driving the one or more LEDs. Additionally, based on the value of the digital input signal, the processing element generates a partition control signal. For example, in a two-partition implementation of a flash LED driver when the digital input signal is an 8-bit binary sequence representing a value in a range of [0, 127], the processing element maps the digital input signal with an offset to an 8-bit control signal in a range of [1, 255]. For example, when the digital input signal is an 8-bit binary sequence representing a value in a range of [0, 127], the processing element maps the digital input signal to a control signal by performing an arithmetic left shift by one bit and performing a complement of (e.g., inverting) the least-significant bit (LSB) of the control signal after the arithmetic left shift is performed. Further, the processing element generates the partition control signal to control one or more switching devices, such as transistors, of the flash LED driver to divide VHR based on the number of partitions of the flash LED driver. When the digital input signal is an 8-bit binary sequence representing a value in a range of [128, 255], the processing element maps the digital input signal directly to an 8-bit control signal in a range of [128, 255]. Further, the processing element generates the partition control signal to control more switching devices, such as transistors, of the flash LED driver to not divide VHR based on the number of partitions of the flash LED driver.

For example, in a two-partition system, VHR has approximately a first value for a first digital signal input range and a second value for a second digital signal input range. Whether VHR has the first value or the second value is determined by the value of the digital input signal and is controlled by the partition control signal. For example, when the partition control signal has a first value, a first number of transistors are switched into a signal path of the flash LED driver and when the partition control signal has a second value, a second number of transistors are switched into the signal path of the flash LED driver. The number of transistors available for switching into the signal path of the flash LED driver based on the partition control signal, in some examples, is associated with a number of possible partitions of VHR in the flash LED driver. For example, with one partition, one transistor is available for switching into the signal path of the flash LED driver based on the partition control signal. With two partitions, two transistors are available for switching into the signal path of the flash LED driver based on the partition control signal. With four partitions, four transistors are available for switching into the signal path of the flash LED driver based on the partition control signal, etc. The transistors available for switching into the signal path of the flash LED driver based on respective partition control signals are switched into, or out of, the signal path, in some examples, based on the respective partition control signals controlling respective switches for activating or deactivating the transistors. In at least some examples, VHR is approximately equal to a result of a reference current (IREF) multiplied by Ron, with that result then being divided by K, where K is a number of transistors switched into the signal path of the flash LED driver based on the respective partition control signals. IREF, in at least some examples, has limited tolerance for modification to tune VHR and is determined according to IREF=IMAX/ (((Cr_in_max+1)/K)−1), where IMAX is a maximum current sourceable by a single current source of the flash LED driver and Cr_in_max represents a maximum possible value of the digital input signal. Accordingly, at least partially through the partitioning scheme taught herein VHR is reduced by modifying K rather than by decreasing Ron through an increase in physical size of one or more FETs of the flash LED driver. The partitioning scheme brings about the advantage of increased efficiency in operation of the flash LED driver (e.g., by reducing excess VHR and therefore wasted energy) through a dynamically controlled VHR, without negative space tradeoffs typically associated with a reduction in VHR and resulting from an increase in FET size to decrease Ron and correspondingly VHR.

Figure 1:
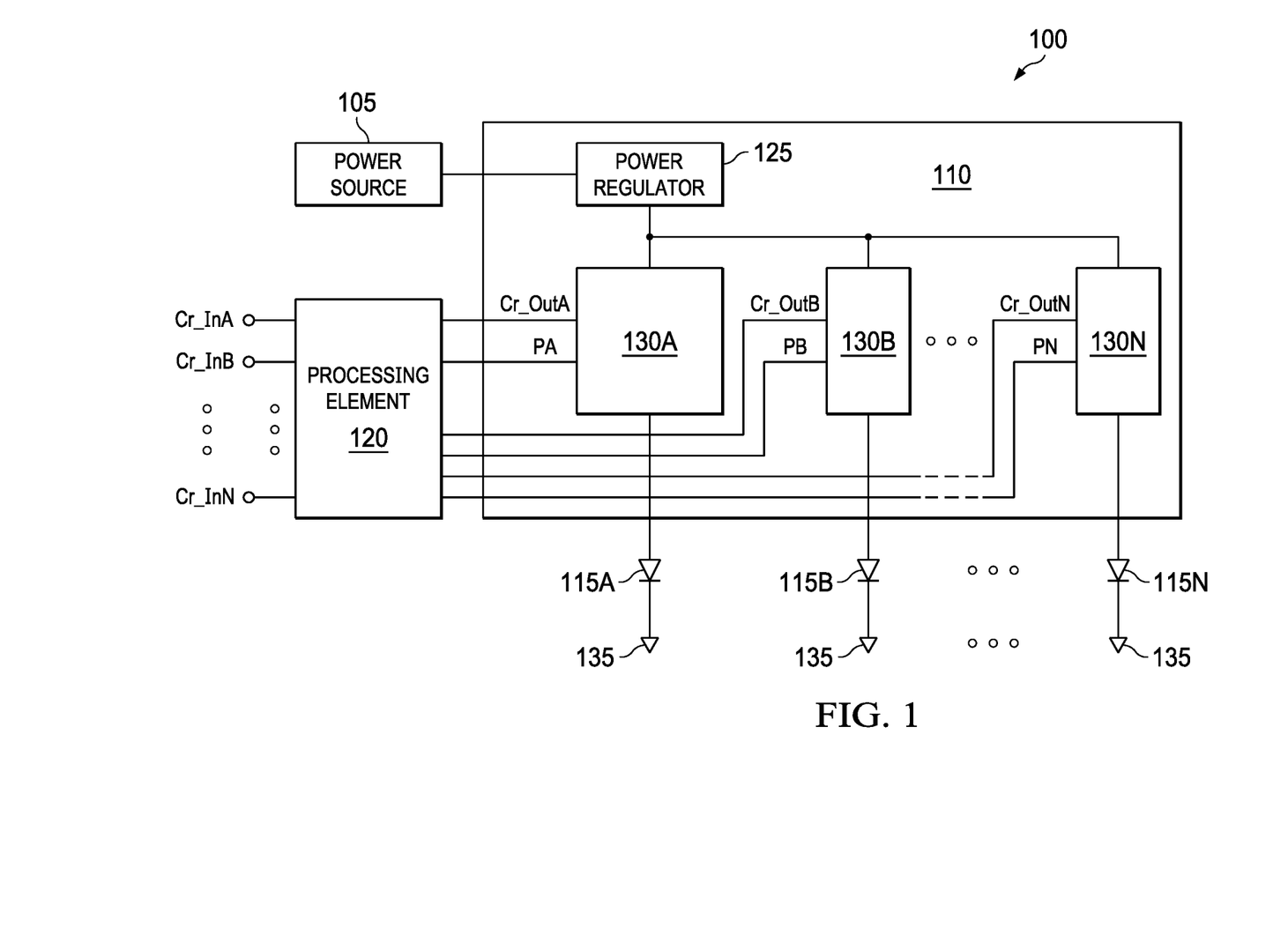
FIG. 1 shows a block diagram of an illustrative system in accordance with various examples.

Turning now to FIG. 1, a block diagram of an illustrative system 100 is shown. In at least some examples, the system 100 is representative of at least some components of a smartphone. In other examples, the system 100 is representative of at least some components of a camera, a flash module suitable for a camera, or any other system suitable for providing a momentary, intense strobe or flash of light that may, or may not, repeat with any frequency (e.g., such as a repeating strobe light, etc.). In at least some examples, the system 100 includes a power source 105, a driver 110, and one or more LEDs 115A, 115B, . . . 115N. In some examples, the system 100 further includes a processing element 120. In other examples, the processing element 120 is a component of the driver 110. In an example architecture of the system 100, the driver 110 is coupled to the power source 105 and each of the LEDs 115A-115N (which are each coupled between the driver 110 and a ground node 135) and configured to drive the LEDs 115A-115N with a current generated based on power received from the power source 105 and having a value determined according to a brightness code received from the processing element 120. Accordingly, in at least some examples (such as when the processing element 120 is not a component of the driver 110), the driver 110 is coupled to the processing element 120 and configured to receive a digital input signal (e.g., the brightness code) from the processing element 120. In at least some examples, the driver 110 is further configured to receive a partition control signal, illustrated as PA, PB, . . . PN in FIG. 1, from the processing element 120.

The driver 110, in some examples, includes a power regulator 125 and one or more current sources 130A-130N, where a number of current sources is determined according to a desired number of individual channels of control for the driver 110 (e.g., a number of separate LEDs that may be driven with different signals at any one given time by the driver 110). For the sake of simplicity of description and ease of understanding, operation of the system 100, the driver 110 will be described with respect to the current source 130A and a single LED, referencing the LED 115A. In an example of operation of the system 100, to determine the partition control signal, the processing element 120 maps a received digital input signal Cr_in to a digital output signal Cr_out, and based on the value of Cr_in and/or Cr_out, generates the partition control signal. For example, Cr_in, in at least some implementations, is a brightness control signal, where a value of Cr_in corresponds to a desired brightness of the LED 115A, with a minimum value of Cr_in corresponding to minimal or no light being emitted by the LED 115A and a maximum value of Cr_in corresponding to a maximum possible amount of light being emitted by the LED 115A. For example, when Cr_in is an 8-bit signal (e.g., represented by Cr_in [7:0]), the minimum value of Cr_in is a decimal 0 (e.g., binary [0000 0000]) and the maximum value of Cr_in is decimal 255 (e.g., binary [1111 1111]). Based on the value of Cr_in, the processing element maps Cr_in to Cr_out. For Cr_in having a decimal value in a range of 0 to 127, corresponding to a binary value of [0000 0000] to [0111 1111], the processing element 120 maps Cr_in to Cr_out having a decimal value in a range of 1 to 255, corresponding to a binary value in a range of [0000 0001] to [1111 1111] with a partition value, K, of 2. For Cr_in having a decimal value in a range of 128 to 255, corresponding to a binary value of [1000 0000] to [1111 1111], the processing element 120 maps Cr_in to Cr_out having a decimal value also in a range of 128 to 255 and also corresponding to a binary value in a range of [1000 0000] to [1111 1111] with the partition value, K, of 1. When the partition value is 1, the processing element 120, in some examples, generates the partition control signal to have a value of 0. When the partition value is 2, the processing element 120, in some examples, generates the partition control signal to have a value of 1. Generally, the partition control signal, such as when operating according to 2 or more partitions is possible in the current source 130A, has a value of K−1 when operating according to K partitions. The processing element 120 then provides Cr_out and the partition control signal to the driver 110 for driving the LED 115A.

The driver 110 drives each of the LEDs 115A-115N with a corresponding current source 130A, where each current source implements a binary-weighted digital-to-analog converters (DAC) (not shown) to cause a respective one of the LEDs 115A-115N to produce and/or output light (either within, or outside of, a visible spectrum). In at least some examples, the current source 130A, and therefore the driver 110, is capable of operating according to a plurality of partitions, as described herein, to dynamically control VHR. In at least some examples, the power regulator 125 generates VOUT for powering the binary-weighted DAC to drive the LED 115A. An excess of VOUT compared to a maximum voltage requirement of the LEDs 115A-115N (e.g., a maximum value from among the forward bias voltages for each LED of the LEDs 115A-115N that is active or being driven to output light at a given time, referred to hereinafter as VLED) is VHR for the current source 130A. In at least some examples, efficiency of the current source 130A (and therefore the driver 110) is maximized when VHR is minimized. To minimize VHR for at least some operational conditions, the driver 110 is configured to operate according to one or more partitions. For example, when operating according to one partition, VHR is approximately equal to IREF*Ron. When operating according to two partitions, VHR is approximately equal to (IREF*Ron)/2. When operating according to four partitions, VHR is approximately equal to (IREF*Ron)/4. More generally, when operating according to K partitions, VHR is approximately equal to (IREF*Ron)/K.

In at least some examples, one or more FETs (not shown) are coupled in parallel in the current source 130A, where the number of FETs coupled in parallel is equal to the largest value of K at which the driver 110 is capable of operating. For example, when the driver 110 is configured to operate according to one of two partitions, the driver 110 includes two FETs coupled in parallel. When the driver 110 is configured to operate according to one of four partitions, the driver 110 includes four FETs coupled in parallel. Each FET coupled in parallel is switched, such that it is capable of being switched into, or out of, a signal path of the binary-weighted DAC based on one or more partition control signals, as discussed above.

Figure 2:
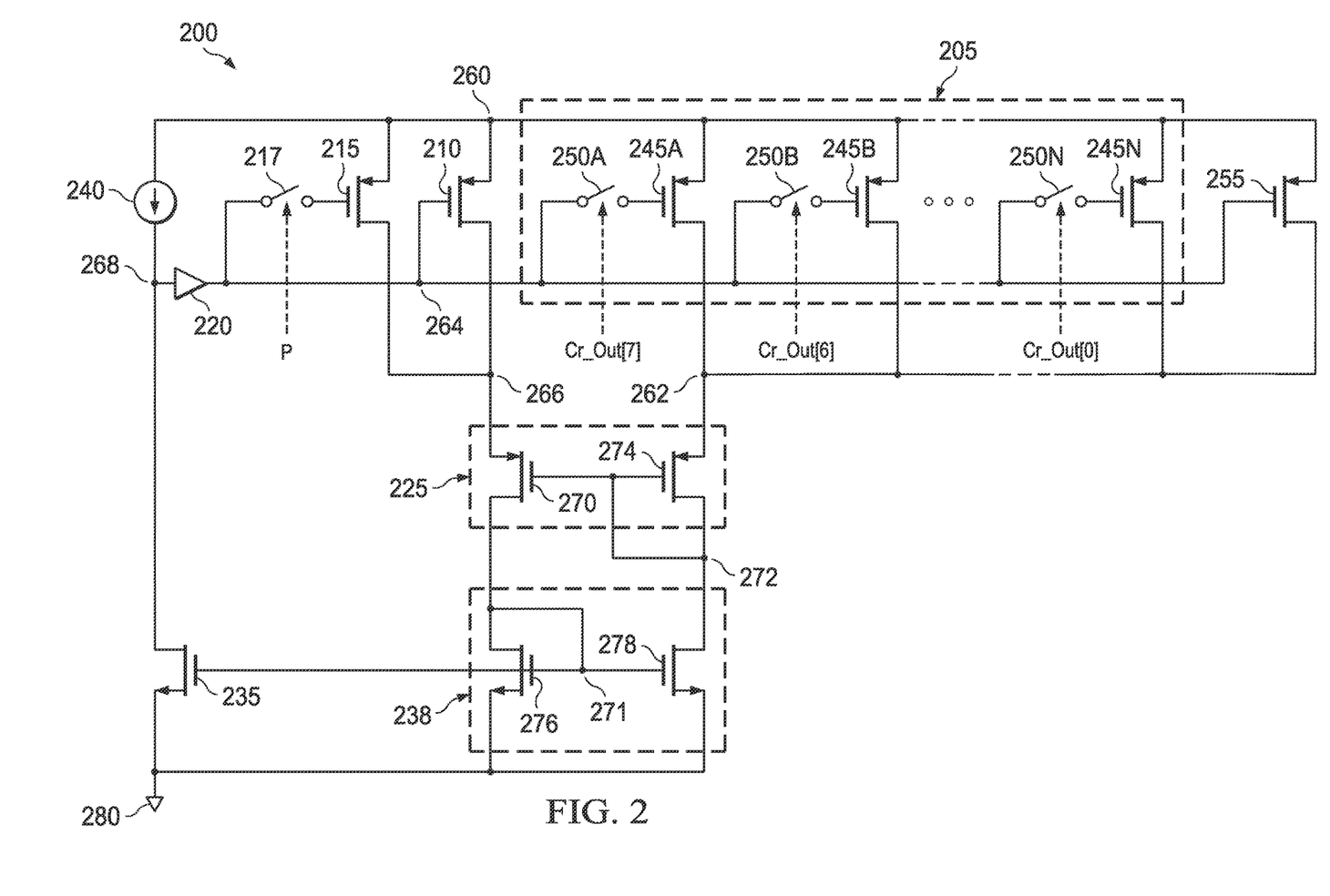
FIG. 2 shows a schematic diagram of an illustrative circuit in accordance with various examples.

Turning now to FIG. 2, a schematic diagram of an illustrative circuit 200 is shown. In at least some examples, the circuit 200 is representative of a current source, such as a current source suitable for implementation in a driver, such as the driver 110 of the system 100 of FIG. 1. The circuit 200, in at least some examples, includes a binary-weighted DAC 205, a transistor 210, a transistor 215, a switch 217, a buffer circuit 220, a current mirror 225, a current mirror 238, a transistor 235, and a current source 240. The binary-weighted DAC 205 includes a plurality of transistors 245A, 245B, . . . 245N each having an associated switch 250A, 250B, . . . 250N. Because the binary-weighted DAC 205 is binary-weighted, in at least some examples the transistor 245N is representative of a single transistor (e.g., $2^{\wedge}(N-N)$ transistors), the transistor 245B is representative of $2^{\wedge}(N\ 1)$ transistors coupled in parallel, and the transistor 245A is representative of $2^{\wedge}N$ transistors coupled in parallel. The binary-weighted DAC 205 further includes a transistor 255. In at least some examples, each of the transistors 245A-245N is a p-type FET and each of the switches 250A-250N is an n-type FET. Additionally, in at least some examples the transistor 210, the transistor 215, and the transistor 255 are each p-type FETs. Although not shown, in at least some examples the gate terminals of each of the transistors 245A-245N are coupled to an additional switch that is configured to couple the gate terminal of each respective transistor 245A-245N to the node 260 when a respective and corresponding switch 250A-250N is in an open state.

In an example architecture of the circuit 200, the transistor 245A has a source terminal coupled to a node 260, a drain terminal coupled to a node 262, and a gate terminal coupled to a node 264 through the switch 250A. The switch 250A is configured to receive a most significant bit of a control signal (e.g., Cr_out) received from a processing element (not shown) for controlling an amount of current sourced to the node 262 by the circuit 200, and therefore the brightness of one or more LEDs coupled to the node 262. As shown in FIG. 2, the circuit 200 is configured to receive Cr_out as an 8-bit value, such that Cr_out [7:0] is received by the circuit 200 for controlling the switches 250A-250N, respectively. In other examples, the architecture and operational concept of the circuit 200 is extendable and/or modifiable to support Cr_out having any desired number of bits. Each of the remaining transistors 245B-245N and switches 250B-250N are coupled in substantially a same manner as the transistor 245A and switch 250A, as illustrated in FIG. 2, and each switch 250 is configured to receive, and be controlled by, a next bit of Cr_out until the switch 250N receives Cr_out [0].

The transistor 210 has a source terminal coupled to the node 260, a drain terminal coupled to a node 266, and a gate terminal coupled to the node 264. The transistor 215 has a source terminal coupled to the node 260, a drain terminal coupled to the node 266, and a gate terminal coupled to the node 264 through the switch 217. The switch 217, in at least some examples, is configured to receive, and be controlled by, a partition control signal. While the transistor 215, with the switch 217, are shown for the sake of description and ease of understanding in parallel with the transistor 210, in various examples a number of additional transistors with associated switches coupled in parallel with the transistor 210 is determined according to K, as discussed herein. The current source 240 is coupled between the node 260 and a node 268 and configured to source IREF to the node 268. The buffer circuit 220 is coupled between the node 268 and the node 264. In at least some examples, the buffer circuit 220 is an inverter configured to operate as a buffer between the node 268 and the node 264, providing a buffered version of IREF to the node 264. In other examples, the buffer circuit 220 is an inverting amplifier configured to operate as a buffer between the node 268 and the node 264. In yet other examples, the buffer circuit 220 is any component or components configured to operate as a buffer between the node 268 and the node 264. The current mirror 225 includes a transistor 270 having a source terminal coupled to the node 266, a drain terminal coupled to a node 271, and a gate terminal coupled to a node 272, as well as a transistor 274 having a source terminal coupled to the node 262, a drain terminal coupled to the node 272, and a gate terminal coupled to the node 272. The current mirror 230 includes a transistor 276 having a drain terminal coupled to the node 271, a source terminal coupled to a ground node 280, and a gate terminal coupled to the node 271, as well as a transistor 278 having a drain terminal coupled to the node 272, a source terminal coupled to the ground node 280, and a gate terminal coupled to the node 271. The transistor 235 has a drain terminal coupled to the node 268, a source terminal coupled to the ground node 280, and a gate terminal coupled to the node 271. The current mirror 225, current mirror 230, and transistor 235 together form self-biasing current sense structure that operates as a negative feedback regulation loop. For example, current flowing through the transistor 235 is representative of ILED and is compared by the current mirror 225 and the current mirror 230 to IREF to regulate the voltage present at the node 264.

In an example of operation of the circuit 200, Cr_out is received from a processing element and ILED is sourced to the node 262 based on a value of Cr_out. For example, each bit of Cr_out controls operation of one of the transistors 245A-245N of the binary-weighted DAC 205 by controlling an open or closed status of a corresponding switch 250A-250N. A greater value of Cr_out (e.g., more received bit of Cr_out having a logical high value) corresponds to a greater number of the transistors 245A-245N operating in a conductive state (e.g., such as in a linear region of operation) and sourcing ILED to the node 262, from the node 260. The more of the transistors 245A-245N that are in conductive states and sourcing ILED to the node 262, the larger ILED becomes in value. A voltage of a signal present at the node 264, as output by the buffer circuit 220 and based at least partially on IREF, controls one or more of the transistor 210, transistor 215, transistors 245A-245N, and/or transistor 235, subject to statuses of the switch 217 with respect to the transistor 215 and switches 250A-250N with respect to corresponding transistors 245A-245N, to turn on and operate in a conductive state or turn off and be substantially non-conductive. In at least some examples, the voltage of the signal present at the node 264 has a value with respect to a value of the signal present at the node 260 sufficient to create a gate-to-source voltage of the transistor 210, transistor 215, transistors 245A-245N, and/or transistor 235 sufficient to cause the transistor 210, transistor 215, transistors 245A-245N, and/or transistor 235, respectively, to operate in a linear region of operation.

Cr_out, in at least some examples, is a component of a partitioned control scheme. For example, when operating according to a first partition, Cr_out has a value of about 128 to about 255, represented by an 8-bit binary sequence of [1000 0000] to [1111 1111]. When operating according to a second partition, Cr_out has a value of about 1 to about 255, represented by an 8-bit binary sequence of [0000 0001] to [1111 1111]. The partition is represented by the partition control signal, represented in FIG. 2 as P. In some examples, the partition control signal is a multi-bit digital signal, where each bit is provided to a respective switch for switching a transistor into, or out of, a signal path of the circuit 200. In at least some examples, a greater number of transistors switched into the signal path of the circuit 200, the lower VHR becomes. For example, as discussed above, VHR is approximately equal to (Ron*IREF)/K. When the number of transistors switched in the signal path increases, K increases equally, reducing VHR without requiring a reduction in IREF or an increase in size of the transistors 245A-245N to decrease Ron. Accordingly, when operating according to one partition, K has a value of 1, for example, represented by the transistor 210 being active in the signal path of the circuit 200 and the transistor 215 being inactive by way of the switch 217 being controlled by the partition control signal to have an off status. When operating according to two partitions, K has a value of 2, for example, represented by the transistor 210 being active in the signal path of the circuit 200 and the transistor 215 being active in parallel with the transistor 210, by way of the switch 217 being controlled by the partition control signal to have an on status.

Increasing K reduces VHR, in at least some examples, by increasing a number of the transistors 245A-245N active and conducting between the node 260 and the node 262 while providing a same ILED. For example, the current mirror 225 and the current mirror 230 provide negative feedback such that current flowing through the node 266 is proportional to (e.g., a ratio of) current flowing through the node 262 and voltages at the node 266 and the node 262 are approximately equal. Further, because of the negative feedback loop of the current mirror 225, current mirror 230, and transistor 235, the current flowing from the node 260 to, and through, the node 266 is approximately equal to IREF. The ratio of current flowing through the node 262 to the current flowing through the node 266 is determined, at least partially, by the number of the transistors 245A-245N active and conducting between the node 260 and the node 262. As such, in the absence of the partitioning scheme of the present disclosure, for a Cr_in of 127, Cr_out would also be 127. However, under the partitioning scheme of the present disclosure, for a Cr_in of 127, Cr_out is 255. The increase in value of Cr_out and the increase of K from 1 to 2 results in a greater number of the transistors 245A-245N being active and conducting between the node 260 and the node 262 while providing a same ILED. For example, in both circumstances in which no partitions are employed and for a Cr_in of 127, Cr_out is 127, and K is 1, as well as a circumstance in which partitions are employed and for a Cr_in of 127, Cr_out is 255, and K is 2, ILED is approximately equal to 127*IREF.

Figure 3:
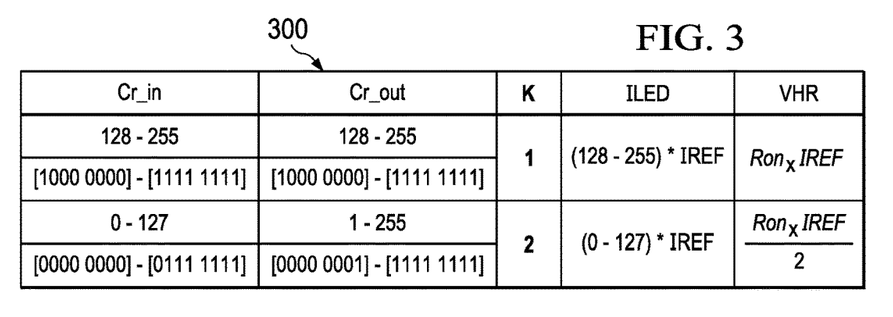
FIG. 3 shows a table illustrating a signal mapping in accordance with various examples.

Turning now to FIG. 3, a table 300 illustrating a signal mapping is shown. In at least some examples, the table 300 is representative of at least some signals and relationships present in the system 100 of FIG. 1 and/or the circuit 200 of FIG. 2. For example, the table 300 illustrates a mapping between Cr_in and Cr_out, as performed by the processing element 120 of the system 100, as well as a partition associated with the mapping, ILED associated with the mapping, and VHR associated with the mapping. As illustrated in table 300, for Cr_in having a decimal value in a range of 0 to 127, corresponding to a binary value of [0000 0000] to [0111 1111], the processing element 120 maps Cr_in to Cr_out having a decimal value in a range of 1 to 255, corresponding to a binary value in a range of [0000 0001] to [1111 1111] with a partition value, K, of 2. For Cr_in having a decimal value in a range of 128 to 255, corresponding to a binary value of [1000 0000] to [1111 1111], the processing element 120 maps Cr_in to Cr_out having a decimal value also in a range of 128 to 255 and also corresponding to a binary value in a range of [1000 0000] to [1111 1111] with the partition value, K, of 1. As further shown by the table 300, Cr_out, for K=1, has a VHR of Ron*IREF, whereas Cr_out, for K=2, has a VHR of (Ron*IREF)/2, reducing the value of VHR. As further shown by the table 300, despite the reduction in VHR, ILED remains linearly related to Cr_in, where ILED is approximately equal to IREF multiplied by Cr_in. In this way, as discussed above, VHR is reduced without a modification to IREF or a decrease in Ron.

Figure 4:
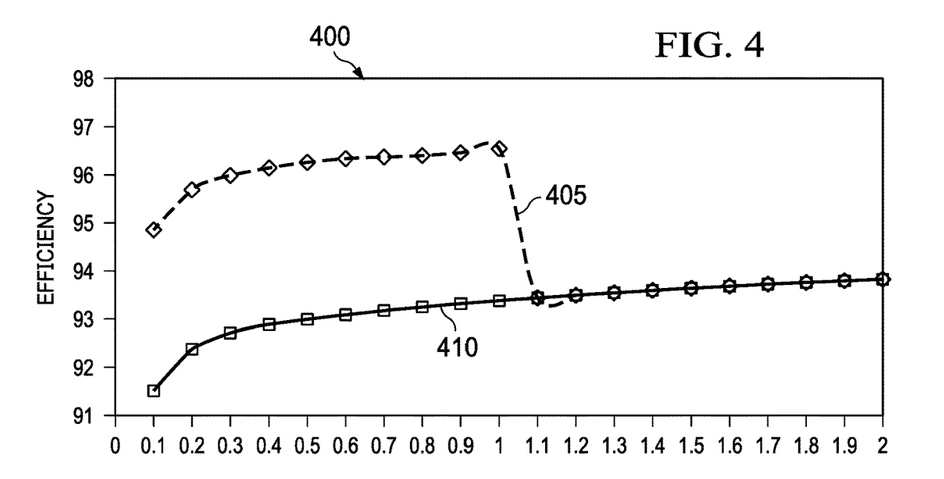
FIG. 4 shows a diagram of illustrative signals in accordance with various examples.

Turning now to FIG. 4, a diagram 400 of illustrative signals is shown. The diagram 400 illustrates a signal 405 and a signal 410. The signal 405 illustrates one example of VHR in a dynamic VHR system, such as the system 100 described above with respect to FIG. 1, and the signal 410 illustrates VHR in a constant VHR system. A horizontal axis of the diagram 400 represents current (from 0 amps to 2 amps) sourced through an LED, such as one of the LEDs 115A-115N, and a vertical axis represents efficiency (such as determined, in one example, by a result of VLED divided VOUT multiplied by 100). As illustrated by the diagram 400, for currents less than 1 amp, corresponding to the system 100 operating according to two partitions, VHR efficiency ranges between approximately 95% and approximately 97%. Over the same range, a constant VHR system illustrated by the signal 410 has VHR efficiency that ranges from about 91.5% to about 93.5%. VHR efficiency illustrated by both the signal 405 and the signal 410 are approximately equal for currents greater than 1 amp, corresponding to the system 100 operating according to one partition.

Figure 5:
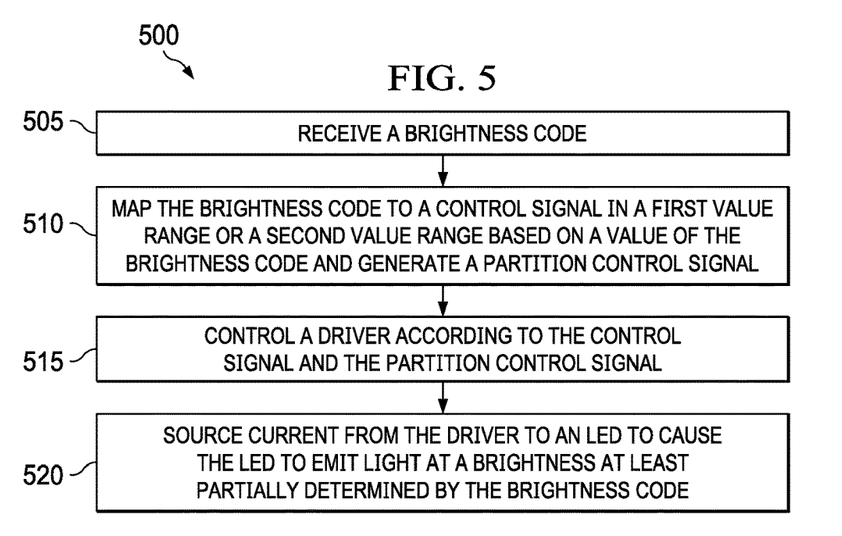
FIG. 5 shows a flowchart of an illustrative method in accordance with various examples.

Turning now to FIG. 5, a flowchart of an illustrative method 500 is shown. The method 500 is, in some examples, a method for control of a light emitting component, such as a LED. The method 500 is implemented, in some examples, at least partially by the system 100 and/or the circuit 200.

At operation 505, a brightness code is received. The brightness code is received, in some examples, as a digital value. In other examples, the brightness code is received as an analog value and is converted to a digital value. The brightness code, in at least some examples, defines a desired brightness level for a LED coupled to a system executing the method 500. In at least some examples, an amount of current sourced to the LED is determined according to the brightness code.

At operation 510, the brightness code is mapped to a control signal in a first value range or a second value range based on a value of the brightness code. The brightness code is mapped to the control signal, in at least some examples, by a processing element. The control signal is, in at least some examples, a digital value. When the brightness code is an 8-bit digital signal and the system implementing the method 500 is configured to operate according to two partitions, a lower half of the brightness code is mapped to the control signal in a first value range and an upper half of the brightness code is mapped to the control signal in a second value range. For example, when the brightness code has a decimal value in a range of about 0 to about 127, the brightness code is mapped to a control signal having a decimal value in a range of about 1 to about 255. When the brightness code has a decimal value in a range of about 128 to about 255, the brightness code is mapped to a control signal having a decimal value of about 128 to about 255. Additionally, when the brightness code has the decimal value in the range of about 0 to about 127, the system executing the method 500 is configured to generate a partition control signal configured to cause the system to operate according to two partitions. When the brightness code has the decimal value in the range of about 128 to about 255, the system executing the method 500 is configured to generate the partition control signal configured to cause the system to operate according to one partition. While two partitions are discussed with reference to the method 500, as discussed elsewhere herein, any suitable number of partitions are acceptable as determined by desired performance (e.g., such as system efficiency and/or VHR) and use case of the system executing the method 500.

At operation 515, a driver is controlled according to the control signal and the partition control signal. For example, the driver includes a binary-weighted DAC, where each respective bit of the control signal is received by a different switching device that exerts control over coupling of a gate terminal of a transistor of the binary-weighted DAC to a common node of the binary-weighted DAC. Based on the control signal, the switching devices are configured to have a status of on or a status of off to cause the transistors to be in a conductive or non-conductive state, respectively. Each of the transistors in a conductive state sources ILED for driving the LED. The driver is further controlled by the partition control signal. When the partition control signal has a value configured to cause the system to operate according to two partitions, the partition control signal causes a switch to have an on status to couple two transistors in parallel to a first arm of a current mirror, where a second arm of the current mirror is coupled to the node to which ILED is sourced. When the partition control signal has a value configured to cause the system to operate according to one partition, the partition control signal causes the switch to have an off status such that only one transistor is coupled to the first arm of the current mirror and the second transistor is de-coupled from the first arm of the current mirror. In at least some examples, VHR in the driver is controlled based on the partition control signal such that VHR decreases when the number of transistors coupled in parallel to the first arm of the current mirror increases.

At operation 520, current is sourced to the LED to cause the LED to emit light at a brightness at least partially determined by the brightness code received at operation 505. Accordingly, in at least some examples, a value of ILED is determined at least partially according to the brightness code.

While the operations of the method 500 have been discussed and labeled with numerical reference, in various examples the method 500 includes additional operations that are not recited herein, in some examples any one or more of the operations recited herein include one or more sub-operations (e.g., such as intermediary comparisons, logical operations, output selections such as via a multiplexer, etc.), in some examples any one or more of the operations recited herein is omitted, and/or in some examples any one or more of the operations recited herein is performed in an order other than that presented herein (e.g., in a reverse order, substantially simultaneously, overlapping, etc.), all of which is intended to fall within the scope of the present disclosure.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hard-wired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A method, comprising:
    receiving, by a driver, a first control signal, wherein the driver includes a power regulator having a regulator output, and the driver further including current sources, each current source having a respective current source input coupled to the regulator output;
    receiving, by the driver, a second control signal;
    in response to the driver determining that the second control signal has a first value, instructing a digital-to-analog converter (DAC) to produce a current with a first voltage headroom (VHR) value, responsive to the first control signal and a reference current; and
    in response to the driver determining that the second control signal has a second value, instructing the DAC to produce the current with a second VHR value.

2. The method of claim 1, further comprising:
    receiving, by a processing element, an input signal;
    partitioning, by the processing element, the input signal, to produce the second control signal, wherein the partitioning includes:
    responsive to the input signal having a value in a first range, mapping the input signal to the first range; and
    responsive to the input signal having a value in a second range, mapping the input signal to the second range.

3. The method of claim 2, wherein the driver comprises:
    the DAC having a first DAC terminal and a second DAC terminal;
    a first transistor having first and second current terminals and a first control terminal, wherein the first current terminal is coupled to the first DAC terminal;
    a second transistor having third and fourth current terminals and a second control terminal, wherein the third current terminal is coupled to the first DAC terminal, and the fourth current terminal is coupled to the second current terminal;
    a switch coupled between the second control terminal and the first control terminal;
    a first current mirror coupled to the second current terminal and the second DAC terminal;
    a second current mirror coupled to the first current mirror; and
    a third transistor having fifth and sixth current terminals and a third control terminal, wherein the fifth current terminal is coupled to the first DAC terminal, the sixth current terminal is coupled to the second DAC terminal, and the third control terminal is coupled to the first control terminal, the method further comprising:

receiving, by the DAC, the first control signal from the processing element; and receiving, by the switch, the second control signal.

4. The method of claim 3, wherein the first current mirror includes:

a fourth transistor having seventh and eighth current terminals and a fourth control terminal, wherein the seventh current terminal is coupled to the second current terminal; and a fifth transistor having ninth and tenth current terminals and a fifth control terminal, wherein the ninth current terminal is coupled to the second DAC terminal, the tenth current terminal is coupled to the fourth control terminal, and the fifth control terminal is coupled to the fourth control terminal; and wherein the second current mirror includes:

a sixth transistor having eleventh and twelfth current terminals and a sixth control terminal, wherein the twelfth current terminal is coupled to a ground terminal, the eleventh current terminal is coupled to the eighth current terminal, and the sixth control terminal is coupled to the eighth current terminal; and a seventh transistor having thirteenth and fourteenth current terminals and a seventh control terminal, wherein the fourteenth current terminal is coupled to the ground terminal, the thirteenth current terminal is coupled to the fourth control terminal, and the seventh control terminal is coupled to the eighth current terminal.

5. The method of claim 4, wherein the DAC includes:

transistors, each respective transistor having a source coupled to the first DAC terminal, a drain coupled to the second DAC terminal, and a gate; and switches, wherein each of the respective switches is coupled between a gate of a respective transistor and the first control terminal, and wherein each of the switches is configured to receive and be controlled by one bit of the first control signal;

wherein a number of the transistors and a number of the switches corresponds to a number of bits of the first control signal.

6. The method of claim 5, wherein the driver further includes:

an eighth transistor having fifteenth and sixteenth current terminals and an eighth control terminal, wherein the sixteenth current terminal is coupled to the ground terminal, and the eighth control terminal is coupled to the eighth current terminal;

a buffer circuit having an input and an output, wherein the input is coupled to the fifteenth current terminal, and the output is coupled to the first control terminal; and a current source coupled between the first DAC terminal and the fifteenth current terminal.

7. The method of claim 1, wherein the first VHR value is greater than the second VHR value, and wherein the second VHR value is reduced without modifying the reference current.

8. A circuit, comprising:

a digital-to-analog converter (DAC) having a first DAC terminal and a second DAC terminal, wherein the DAC includes:

transistors, each respective transistor having a source coupled to the first DAC terminal, a drain coupled to the second DAC terminal, and a gate; and switches, wherein each of the respective switches is coupled to a gate of a respective transistor;

a first transistor having first and second current terminals and a first control terminal, wherein the first current terminal is coupled to the first DAC terminal;

a second transistor having third and fourth current terminals and a second control terminal, wherein the third current terminal is coupled to the first DAC terminal, and the fourth current terminal is coupled to the second current terminal; and a switch coupled between the first control terminal and the second control terminal.

9. The circuit of claim 8, further comprising a current mirror coupled to the second current terminal and to the second DAC terminal, wherein the current mirror includes:

a fourth transistor having seventh and eighth current terminals and a fourth control terminal, wherein the seventh current terminal is coupled to the second current terminal; and a fifth transistor having ninth and tenth current terminals and a fifth control terminal, wherein the ninth current terminal is coupled to the second DAC terminal, the tenth current terminal is coupled to the fourth control terminal, and the fifth control terminal is coupled to the fourth control terminal.

10. The circuit of claim 9, wherein the current mirror is a first current mirror, the circuit further comprising a second current mirror including:

a sixth transistor having eleventh and twelfth current terminals and a sixth control terminal, wherein the twelfth current terminal is coupled to a ground terminal, the eleventh current terminal is coupled to the eighth current terminal, and the sixth control terminal is coupled to the eighth current terminal; and a seventh transistor having thirteenth and fourteenth current terminals and a seventh control terminal, wherein the fourteenth current terminal is coupled to the ground terminal, the thirteenth current terminal is coupled to the fourth control terminal, and the seventh control terminal is coupled to the eighth current terminal.

11. The circuit of claim 10, further comprising:

an eighth transistor having fifteenth and sixteenth current terminals and an eighth control terminal, wherein the sixteenth current terminal is coupled to the ground terminal, and the eighth control terminal is coupled to the eighth current terminal;

a buffer circuit having an input terminal and an output terminal, wherein the input terminal is coupled to the fifteenth current terminal, and the output terminal is coupled to the first control terminal; and a current source coupled between the first DAC terminal and the fifteenth current terminal.

12. The circuit of claim 8, wherein the DAC is configured to receive bits of a first control signal and the switch is configured to receive a second control signal.

13. The circuit of claim 12, wherein each of the switches in the DAC is coupled to the first control terminal, and wherein each of the switches is configured to receive and be controlled by one bit of the bits of the first control signal, wherein a number of the transistors and a number of the switches in the DAC corresponds to a number of the bits of the first control signal.

14. The circuit of claim 12, further comprising a processing element configured to:

receive a brightness code;

produce the first control signal by mapping the brightness code to a first value range or a second value range based on a value of the brightness code; and produce the second control signal based on the value of the brightness code, wherein the processing element has a first output and multiple second outputs, wherein the first output is coupled to the switch to provide the second control signal to the switch, and wherein the multiple second outputs are coupled to the DAC to provide the first control signal to the DAC.

15. The circuit of claim 14, wherein the processing element generates the first control signal by:
performing a direct mapping from the brightness code to the first control signal in the first value range responsive to the brightness code having a value in the first value range; and
performing an arithmetic left shift on the brightness code, then complementing a least significant bit of the result of the arithmetic left shift responsive to the brightness code having a value not in the first value range.

16. The circuit of claim 14, wherein the processing element is configured to produce a value of 1 for the second control signal responsive to the brightness code having a value in the first value range, and the processing element is configured to produce a value of 2 for the second control signal responsive to the brightness code having a value not in the first value range.

17. A method comprising:
receiving, by a processing element, a brightness code;
producing, by the processing element, a first control signal by:
mapping the brightness code to a first value range responsive to the brightness code having a value in the first value range, or to a second value range responsive to the brightness code having a value outside the first value range;
performing a direct mapping from the brightness code to the first control signal in the first value range while the brightness code has a value in the first value range; and
performing an arithmetic left shift on the brightness code and complementing a least significant bit of the result of the arithmetic left shift while the brightness code has a value not in the first value range; and
producing, by the processing element, a second control signal responsive to the value of the brightness code.

18. The method of claim 17, wherein producing the second control signal includes setting the second control signal to a value of 1 responsive to the brightness code having a value in the first value range, and setting the second control signal to a value of 2 responsive to the brightness code having a value outside the first value range.

* * * * *